(12) United States Patent
Danilak (10) Patent No.: US 9,501,357 B2
(45) Date of Patent: Nov. 22, 2016

(54) TECHNIQUES FOR PROVIDING DATA REDUNDANCY AFTER REDUCING MEMORY WRITES

(71) Applicant: Seagate Technology LLC, Cupertino, CA (US)

(72) Inventor: Radoslav Danilak, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/821,020

(22) Filed: Aug. 7, 2015

(65) Prior Publication Data

US 2016/0026528 A1    Jan. 28, 2016

Related U.S. Application Data

(63) Continuation of application No. 14/274,769, filed on May 11, 2014, now Pat. No. 9,128,872, which is a continuation of application No. 13/943,446, filed on Jul. 16, 2013, now Pat. No. 8,725,960, which is a continuation of application No. 13/042,252, filed on Mar. 7, 2011, now Pat. No. 8,504,783, which is a continuation of application No. 11/942,629, filed on Nov. 19, 2007, now Pat. No. 7,904,672.

(60) Provisional application No. 60/873,630, filed on Dec. 8, 2006.

(51) Int. Cl.
*G06F 12/02* (2006.01)
*G06F 11/10* (2006.01)
*G06F 12/00* (2006.01)
*G11C 29/52* (2006.01)
*G06F 3/06* (2006.01)

(52) U.S. Cl.
CPC ............ *G06F 11/1076* (2013.01); *G06F 3/064* (2013.01); *G06F 3/0619* (2013.01); *G06F 3/0689* (2013.01); *G06F 11/108* (2013.01); *G06F 11/1072* (2013.01); *G06F 12/00* (2013.01); *G06F 12/0246* (2013.01); *G11C 29/52* (2013.01); *G06F 3/0616* (2013.01); *G06F 3/0661* (2013.01); *G06F 3/0688* (2013.01); *G06F 2211/1073* (2013.01); *G06F 2211/1092* (2013.01); *G06F 2211/1095* (2013.01)

(58) Field of Classification Search
CPC .. G06F 3/0689; G06F 3/0614; G06F 3/0665; G06F 3/0688; G06F 11/0176; G06F 11/2089; G06F 11/008; G06F 11/2005; G06F 11/2071; G06F 2212/1032; G06F 3/0616; G06F 3/0661; G06F 3/0619; G06F 3/064; G06F 11/108; G06F 11/1072; G06F 12/00; G06F 12/0246; G06F 2211/1073; G06F 2211/1092; G06F 2211/1095; G11C 29/52
See application file for complete search history.

(56) References Cited

U.S. PATENT DOCUMENTS 6,049,890 A * 4/2000 Kakuta ............... G06F 11/1076
714/6.21
6,629,158 B1 * 9/2003 Brant .................... G06F 3/0607
710/10

(Continued)

*Primary Examiner* — Hiep Nguyen
(74) *Attorney, Agent, or Firm* — Taylor English Duma LLP (57) ABSTRACT

The present disclosure relates to techniques for providing data redundancy after reducing memory writes. In one example implementation according to aspects of the present disclosure, a storage controller receives a storage command for providing data redundancy in accordance with a first data redundancy scheme. The storage controller then translates the storage command for providing the data redundancy in accordance with a second data redundancy scheme.

20 Claims, 10 Drawing Sheets

(56) References Cited

U.S. PATENT DOCUMENTS

| | | | | |
|---|---|---|---|---|
| 6,675,258 B1 * | 1/2004 | Bramhall | ............... | G06F 8/65 711/100 |
| 7,340,576 B1 * | 3/2008 | Therene | ............ | G06F 12/0804 711/112 |
| 2003/0204774 A1 * | 10/2003 | Humlicek | ........... | G06F 11/1084 714/6.24 |
| 2005/0108594 A1 * | 5/2005 | Menon | ............... | G06F 11/1076 714/6.11 |
| 2009/0055681 A1 * | 2/2009 | Dholakia | ........... | G06F 11/1076 714/6.13 |

* cited by examiner

TECHNIQUES FOR PROVIDING DATA REDUNDANCY AFTER REDUCING MEMORY WRITES

RELATED APPLICATIONS

The present application is a continuation of U.S. patent application Ser. No. 14/274,769, filed on May 11, 2014, which is a continuation of U.S. patent application Ser. No. 13/943,446, filed on Jul. 16, 2013, now U.S. Pat. No. 8,725,960, issued May 13, 2014, which is a continuation of U.S. patent application Ser. No. 13/042,252, filed on Mar. 7, 2011, now U.S. Pat. No. 8,504,783, issued Aug. 6, 2013, which is a continuation of U.S. patent application Ser. No. 11/942,629, filed Nov. 19, 2007, now U.S. Pat. No. 7,904,672, issued Mar. 8, 2011, which claims the benefit of U.S. provisional patent application No. 60/873,630, filed Dec. 8, 2006, all of which are incorporated by reference in their entirety herein.

FIELD OF THE INVENTION

The present invention relates to data storage, and more particularly to data redundancy in storage devices.

BACKGROUND

The storage system is one of the most limiting aspects of performance of modern enterprise computing systems. Performance of hard drive based storage is determined by seek time and time for half rotation. The performance is increased by decreasing seek time and decreasing rotational latency. However, there are limits on how fast a drive may spin. The fastest contemporary drives are reaching 15,000 rpm.

Figure 1:
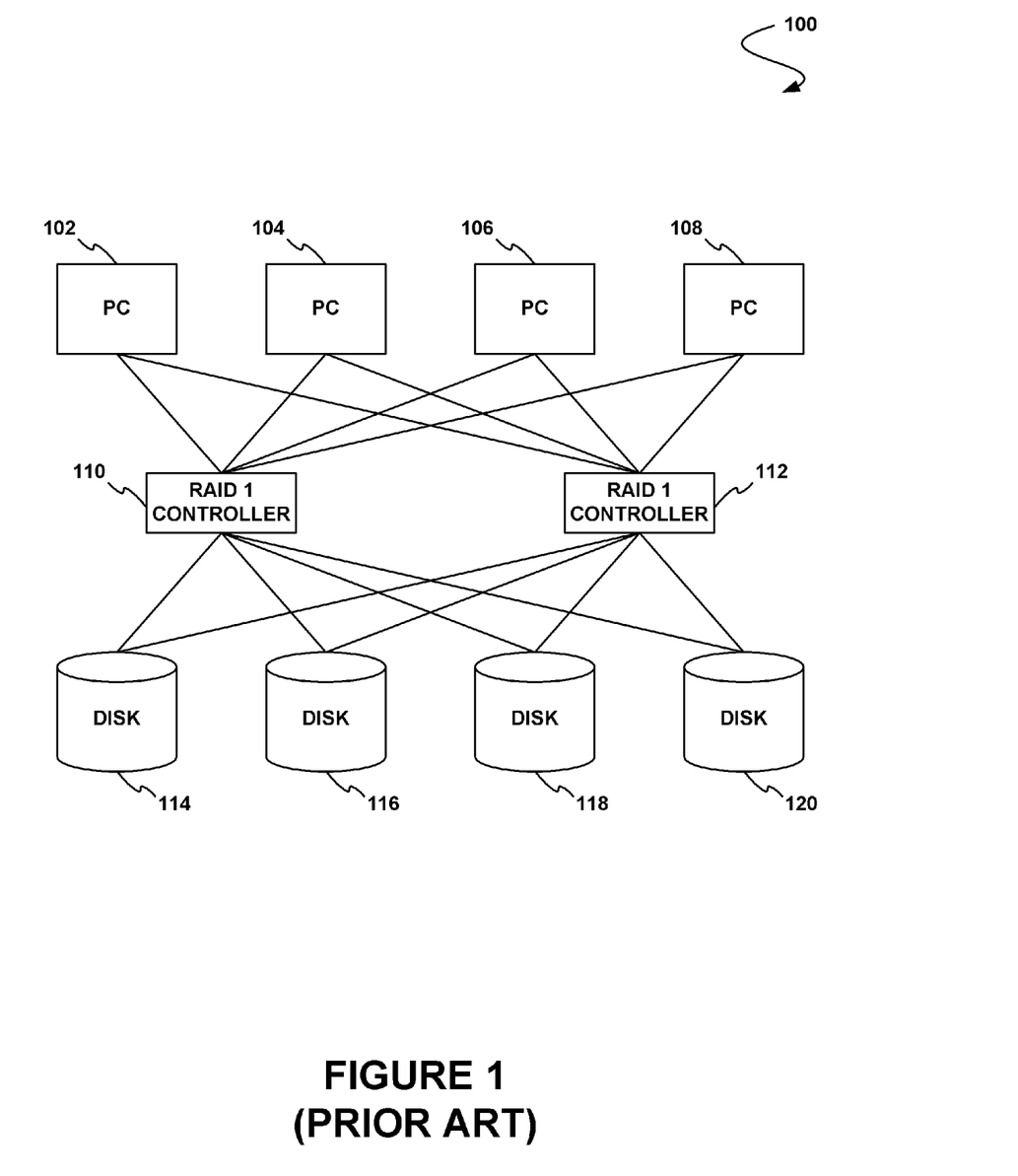
FIG. 1 illustrates a system in accordance with the prior art.

FIG. 1 illustrates a system 100 in accordance with the prior art. In the system 100, at least one computer 102-108 is coupled to a host controller 110 and 112. The host controllers 110 and 112 are coupled to a plurality of disks 114-120.

Often, the system 100 is configured as redundant array of independent disks (RAID)-1, storing mirrored content of the disks 114-116 in the disks 118-120. The disks 114-116 are said to be mirrored by the disks 118-120.

Increased reliability of the computer system is achieved by duplicating the disks 114-116, the host controllers 110 and connections therebetween. Therefore, a reliable computer system is able operate at least in presence of single failure of the disks 114-120, the RAID controllers 110 and 112, the computers 102-108, and the connections therebetween. However, storage system performance may still be inadequate using the system 100. Additionally, increasing the performance of such system is currently costly and often times is not feasible.

Furthermore, one limiting aspect of current storage systems is the fact that many types of storage devices exhibit a limited lifetime. For example, a lifetime of non-volatile memory such as flash is reduced each time it is erased and re-written. Over time and thousands of erasures and re-writes, such storage systems may become less and less reliable.

There is thus a need for addressing these and/or other issues associated with the prior art.

SUMMARY

A system, method, and computer program product are provided for providing data redundancy in a plurality of storage devices. In operation, a number of writes to a plurality of storage devices is reduced. Additionally, after the reducing, data redundancy is provided utilizing a data redundancy scheme.

DETAILED DESCRIPTION

Figure 2A:
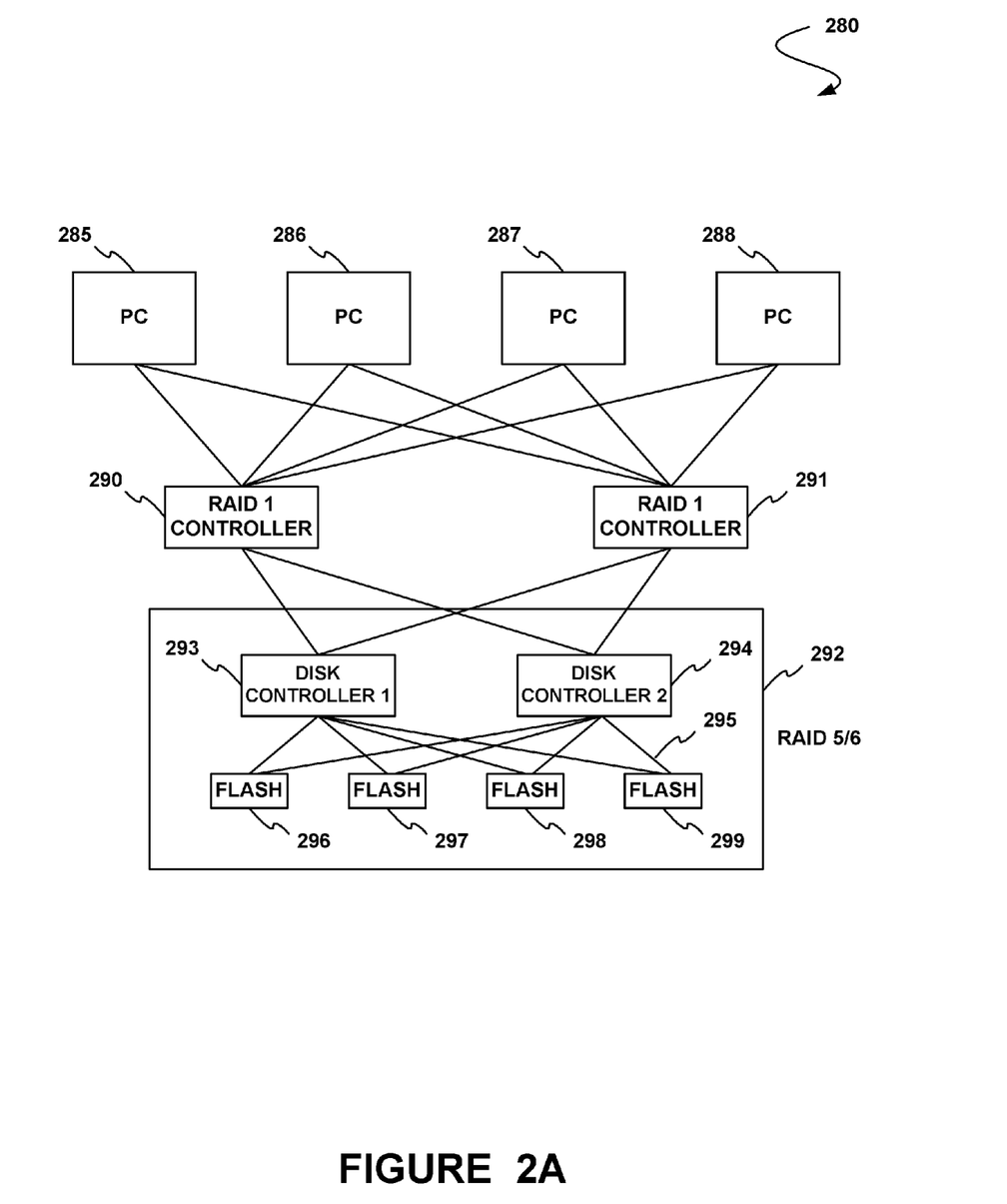
FIG. 2A shows a system for providing data redundancy in a plurality of storage devices, in accordance with one embodiment.

FIG. 2A shows a system 280 for providing data redundancy in a plurality of storage devices, in accordance with one embodiment. As shown, the system 280 includes at least one computer 285-288. The computers 285-288 are in communication with at least one controller 290-291. As shown further, the controllers 290-291 are in communication with a storage system 292 which includes a plurality of disk controllers 293-294 and a plurality of storage devices 296-299. It should be noted that, although the controllers 290291 are shown separately, in another embodiment such controllers 290-291 may be one unit. Additionally, the plurality of disk controllers 293-294 may be one unit or independent units in various embodiments.

In operation, storage commands are received for providing data redundancy in accordance with a first data redundancy scheme. Additionally, the storage commands are translated for providing the data redundancy in accordance with a second data redundancy scheme. Furthermore, the translated storage commands are outputted for providing the data redundancy in the plurality of storage devices 296-299.

In the context of the present description, storage commands refer to any command, instruction, or data to store or facilitate the storage of data. Additionally, in the context of the present description, a data redundancy scheme refers to any type of scheme for providing redundant data or a fault tolerance in a system. For example, in various embodiments, the data redundancy scheme may include, but is not limited to, a redundant array of independent disks (RAID) 0 data redundancy scheme, a RAID 1 data redundancy scheme, a RAID 10 data redundancy scheme, a RAID 3 data redundancy scheme, a RAID 4 data redundancy scheme, a RAID 5 data redundancy scheme, a RAID 50 data redundancy scheme, a RAID 6 data redundancy scheme, a RAID 60 data redundancy scheme, square parity data redundancy scheme, any non-standard RAID data redundancy scheme, any nested RAID data redundancy scheme, and/or any other data redundancy scheme that meets the above definition.

In one embodiment, the first data redundancy scheme may include a RAID 1 data redundancy scheme. In another embodiment, the second data redundancy scheme may include a RAID 5 data redundancy scheme. In another embodiment, the second data redundancy scheme may include a RAID 6 data redundancy scheme.

Further, in the context of the present description, the plurality of storage devices 296-299 may represent any type of storage devices. For example, in various embodiments, the storage devices 296-299 may include, but are not limited to, mechanical storage devices (e.g. disk drives, etc.), solid state storage devices (e.g. dynamic random access memory (DRAM), flash memory, etc.), and/or any other storage device. In the case that the storage devices 296-299 include flash memory, the flash memory may include, but is not limited to, single-level cell (SLC) devices, multi-level cell (MLC) devices, NOR flash memory, NAND flash memory, MLC NAND flash memory, SLC NAND flash memory, etc.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2B:
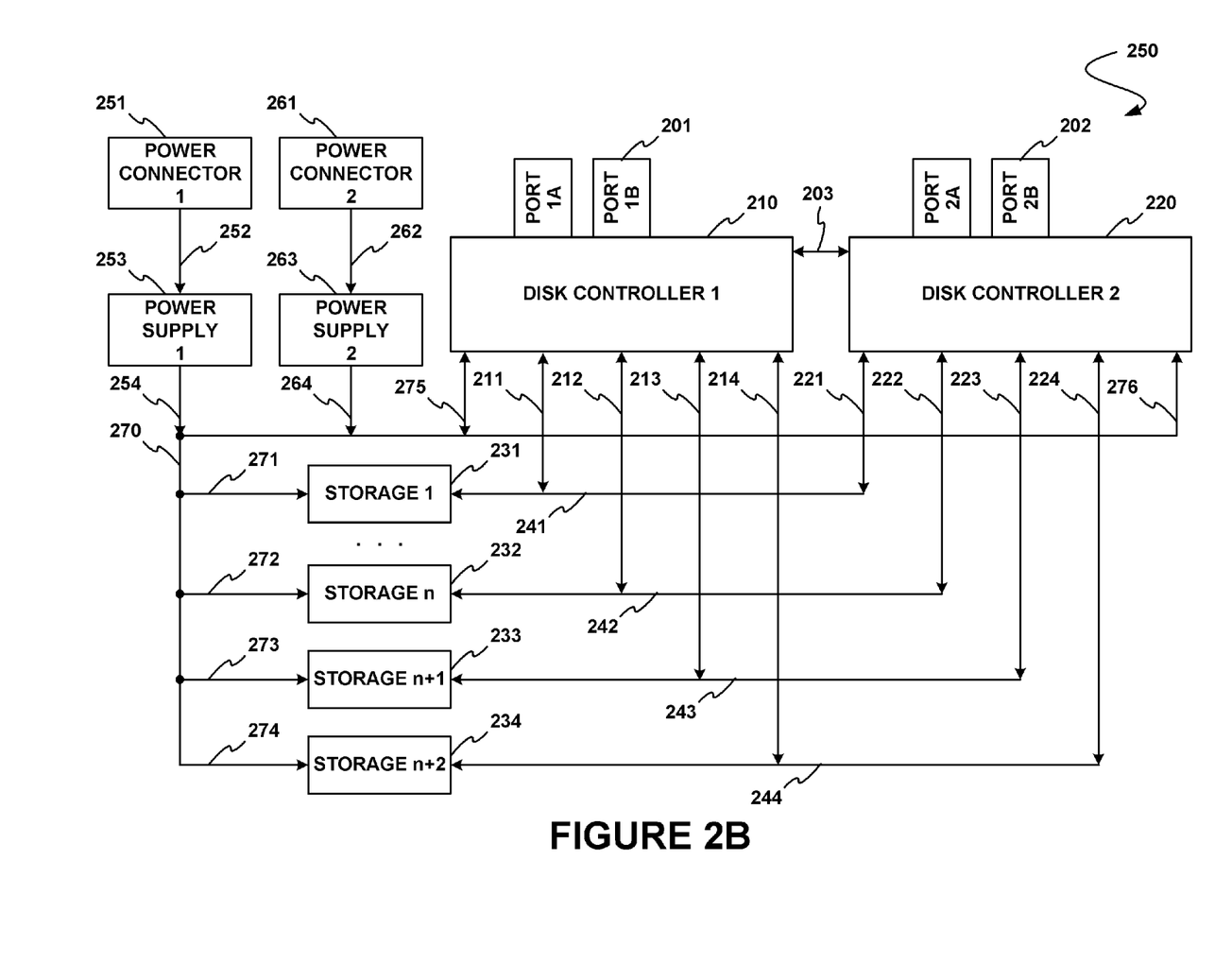
FIG. 2B shows a storage system for providing data redundancy in a plurality of storage devices, in accordance with one embodiment.

FIG. 2B shows a storage subsystem 250 for providing data redundancy in a plurality of storage devices, in accordance with one embodiment. As an option, the storage subsystem 250 may be viewed in the context of the details of FIG. 2A. Of course, however, the storage subsystem 250 may be implemented in the context of any desired environment. It should also be noted that the aforementioned definitions may apply during the present description.

As shown, the storage subsystem 250 includes a plurality of primary storage devices 231-232 and at least one additional storage device 233-234 utilized to increase storage capacity for inclusion of redundant information. The amount of data storage of the storage subsystem 250 may be considered as the sum of the storage capacities of the plurality of primary storage devices 231-232. As an option, the storage capacity may also be expanded through the additional storage device 233-234. Of course, in one embodiment, the additional storage device 233-234 may be used solely to store redundant information computed from stored data.

As shown further, a first disk controller 210 includes at least one port 201. In operation, at least one of the ports 201 may serve as a first port of the storage subsystem 250. Additionally, at least one of the ports 201 may serve as a port of the first disk controller 210 to a disk controller bus 203, power supply connections 275, and internal connections 211-214 coupling the first disk controller 210 to corresponding busses 241-244 of the storage devices 231-234.

The bus 203 couples the first disk controller 210 to a second disk controller 220. In operation, the bus 203 may be used to monitor operation of the first disk controller 210 with the second disk controller 220. When the second disk controller 220 detects a failure of the first disk controller 210, the disk controller 220 may disconnect the internal connections 211-214 from the corresponding busses 241-244 by issuing a disconnect request to the first disk controller 210 via the disk controller bus 203.

The bus 203 coupling the first disk controller 210 to the second disk controller 220 may also be used to monitor operation of the second disk controller 220 using the first disk controller 210. When the first disk controller 210 detects a failure of the second disk controller 220, the first disk controller 210 may disconnect internal connections 221-224 from the corresponding busses 241-244 by issuing a disconnect request to the second disk controller 220 via the disk controller bus 203.

In one embodiment, the first disk controller 210 may detect internal incorrect operation, or incorrect operation associated with the first disk controller 210. In this case, the first disk controller 210 may disconnect the connections 211-214 from the corresponding busses 241-244 when an internal incorrect operation is detected. Similarly, the second disk controller 220 may detect internal incorrect operation, or incorrect operation associated with the second disk controller 220. In this case, the second disk controller 220 may disconnect the connections 221-224 from the corresponding busses 241-244 when an internal incorrect operation is detected.

Additionally, in one embodiment, the first and second disk controllers 210 and 220 may detect a failure of the disk controller bus 203. In this case, the second disk controller 220 may disconnect the connections 221-224 from the corresponding busses 241-244 and the first disk controller 210 may remain active. In another embodiment, the first disk controller 210 may disconnect the connections 211-214 from the corresponding busses 241-244 and the second disk controller 220 may remain active. In still another embodiment, the disk controller that is to remain active may disconnect the connections of the controller that is to be inactive.

It should be noted that the disconnection of the buses 211-214 and 221-224 may be implemented through three state circuits, multiplexers, or any other circuits for disconnecting the busses 211-214 and 221-224. For example, in one embodiment, the disconnection may be accomplished by placing three state bus drivers associated with the disk controllers 210 or 220 into a high impedance state. In another embodiment, the disconnection may be accomplished by controlling multiplexers on an input of the storage devices 231-234.

As shown further, the second disk controller 220 includes at least one port 202. In operation, at least one of the ports 202 may serve as a second port of the storage subsystem 250. Additionally, at least one of the ports 202 may serve as a port of the second disk controller 220 to the disk controller bus 203, power supply connections 276, and internal connections 221-224 coupling the second disk controller 220 to the corresponding busses 241-244 of the storage devices 231-234.

In the case that a single redundant storage device 233 is provided, with no additional redundant storage devices 234, the storage subsystem 250 may operate without a loss of data in the presence of a single failure of any of the storage devices 231-233. In one embodiment, the organization of data and redundant information may be in accordance with RAID 5. In another embodiment, the organization of data and redundant information may be in accordance with RAID 6, RAID 10, RAID 50, RAID 60, square parity redundancy schemas, etc.

In the case that two redundant storage devices 233 and 234 are provided, the storage subsystem 250 may continue to operate without loss of any data in presence of failure of any two of the storage devices 231-234. In operation, the ports 201 and 202 may present data stored in the storage subsystem 250 as two conventional independent mirrored disks. In this case, such conventional independent mirrored disks may appear as RAID 1, RAID 10, RAID 50, RAID 60, square parity redundancy schemas, etc.

The power to the storage subsystem 250 may be supplied through a first power connector 251 coupled to a first power supply unit 253 via electric connections 252. The power to storage subsystem 250 may also be supplied through a second power connector 261 coupled to a second power supply unit 263 via connections 262. As an option, the output of the first power supply 253 and the output of the second power supply 263 may be joined and distributed to the disk controllers 210 and 220 and the storage devices 231-234 through an electric power distribution network 270. The storage devices 231-234 are coupled to the power distribution network 270 via corresponding connections 271-274. The disk controllers 210 and 220 are coupled to the power distribution network 270 via the power supply connections 275 and 276.

In the case that power to the power connector 251 fails, the power to the storage subsystem 250 may be supplied through the power connector 261. Similarly, in the case that power to the power connector 261 fails, the power to the storage subsystem 250 may be supplied through the power connector 251. In the case that the connections 252 fail, the power to the storage subsystem 250 may be supplied through the connections 262. In the case that the connections 262 fail, the power to the storage subsystem 250 may be supplied through the connections 252.

In the case that the power supply 253 fails, power to the storage subsystem 250 may be supplied by the power supply 263. If the power supply 263 fails, power to the storage subsystem 250 may be supplied by the power supply 253. Similarly, when the connections 254 fail, the power to the storage subsystem 250 may be supplied through the connections 264. Likewise, when the connections 264 fail the power to the storage subsystem 250 may be supplied through the connections 254. Thus, the storage subsystem 250 allows for failure of various components, without rendering the storage subsystem 250 inoperable.

In one embodiment, the disk controllers 210 and/or 220 may contain circuits to detect that power to the power supplies 253 and 263 are disconnected. Additionally, such circuits may provide power to save a state of the disk controllers 210 and 220 into the storage devices 231-234 such that no loss of data occurs. For example, a disconnection of the power supply 253 and/or 263 may be detected.

In this case, power may be supplied to the storage devices 231-234, in response to the detection of a disconnection of the power supply 253 and 263. The power supplies 253 and 263 may supply power to the storage subsystem 250 for enough time such that after power to both of the power supplies 253 and 263 is disconnected, writing of the state of the disk controllers 210 and 220 into the storage devices 231434 may be completed. Thus, power may be provided to the storage devices 231434 until at least a point when no data loss will occur as a result of the disconnection of the power supplies 253 and 263. In various embodiments, the power supplies 253 and 263 may include a battery, a capacitor, and/or any other component to provide power to the storage subsystem 250 when the power to the power supplies 253 and 263 is disconnected.

It should be noted that the storage subsystem 250 may continue to operate, without a loss of data, in the presence of any single failure of any element illustrated in FIG. 28. It should also be noted that, in various embodiments, the storage devices 231-234 may be mechanical storage devices, non-mechanical storage devices, volatile or non-volatile storage. Furthermore, it various embodiments, the storage devices 231-234 may include, but is not limited to, DRAM or flash storage (e.g. SLC devices, MLC devices, NOR gate flash devices, NAND gate flash storage devices, etc.).

Furthermore, in one embodiment, the disk controllers 210 and 220 may be implemented as two independent chips. In another embodiment, the disk controllers 210 and 220 may be implemented on one chip or die. Such implementation may be determined based on packaging concerns, for example.

Figure 2C:
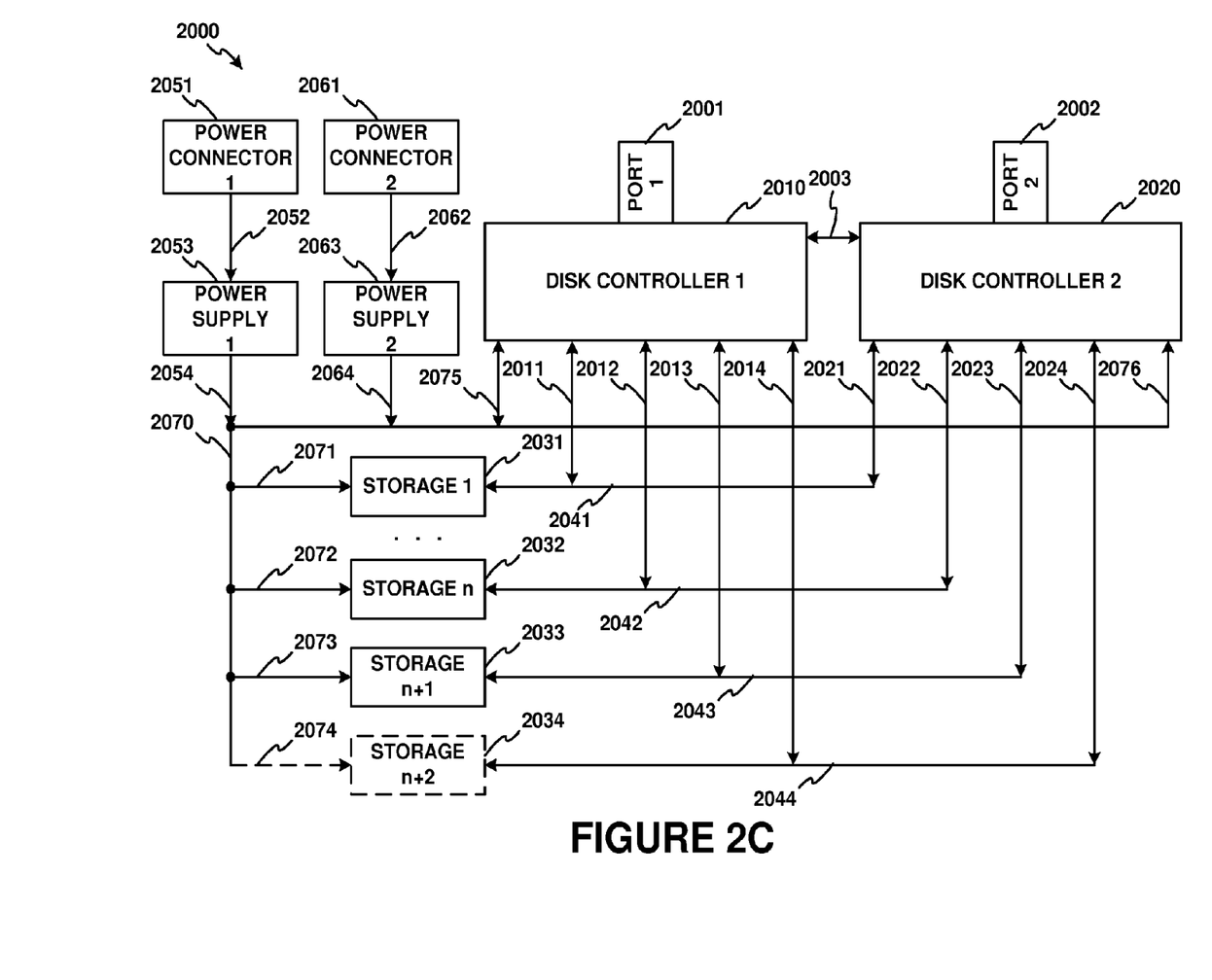
FIG. 2C illustrates a functional block diagram of the present invention according to one embodiment of the invention.

FIG. 2C illustrates a functional block diagram of the present invention according to one embodiment of the invention.

The disk 2000 comprises a of plurality of primary storage devices 2031 and 2032 and one or more storage devices 2033 and 2034 required to increase storage capacity to include redundant information. The amount of data storage of disk 2000 is a sum of storage capacities of the plurality of storage devices 2031 and 2032. The storage capacity expanded through addition redundant storage devices 2033 and optional 2034 is used to store redundant information computed from stored data.

The disk controller 2010 comprises first port 2001 serving as port 1 of disk 2000, disk controller to disk controller bus 2003, power supply connections 2075 and internal storage buses 2011, 2012, 2012, and 2014 coupling first disk controller 2010 to corresponding busses 2041, 2042, 2043, and 2044 of corresponding storage devices 2031, 2032, 2033, and 2034.

The bus 2003 coupling first disk controller 2010 to second disk controller 2020 is used to monitor operation of disk controller 2010 by disk controller 2020. When disk controller 2020 detects failure of disk controller 2010, then disk controller 2020 disconnects connections 2011, 2012, 2013, and 2014 from corresponding busses 2041, 2042, 2043, and 2044 by issuing disconnect request to disk controller 2010 via bus 2003.

The bus 2003 coupling first disk controller 2020 to second disk controller 2010 is used to monitor operation of disk controller 2020 by disk controller 2010. When disk controller 2010 detects failure of disk controller 2020, then disk controller 2010 disconnects connections 2021, 2022, 2023, and 2024 from corresponding busses 2041, 2042, 2043, and 2044 by issuing disconnect request to disk controller 2020 via bus 2003.

When disk controller 2010 detects in itself incorrect operation it will disconnect connections 2011, 2012, 2013, and 2014 from corresponding busses 2041, 2042, 2043, and 2044.

When disk controller 2020 detects in itself incorrect operation it will disconnect connections 2021, 2022, 2023, and 2024 from corresponding busses 2041, 2042, 2043, and 2044.

When connection 2003 failure is detected by disk controllers 2010, 2020 then second disk controller 2020 will disconnect connections 2021, 2022, 2023, and 2024 from corresponding busses 2041, 2042, 2043, and 2044 and first disk controller 2010 only stays active.

The disk controller 2010 comprises second port 2001 serving as port 1 of disk 2000, disk controller to disk controller bus 2003, power supply connections 2075 and internal storage buses 2011, 2012, 2012, and 2014 coupling first disk controller 2010 to corresponding busses 2041, 2042, 2043, and 2044 of corresponding storage devices 2031, 2032, 2033, and 2034.

The disk controller 2020 comprises second port 2002 serving as port 2 of disk 2000, disk controller to disk controller bus 2003, power supply connections 2076 and internal storage buses 2021, 2022, 2022, and 2024 coupling first disk controller 2020 to corresponding busses 2041, 2042, 2043, and 2044 of corresponding storage devices 2031, 2032, 2033, and 2034.

When only single redundant storage devices 2033 is provided and no redundant storage device 2034 is present, then disk 2000 continues to operate without loss of data at least in the presence of a single failure of any of storage devices 2031, 2032, and 2033. The organization of data and redundant information is in accordance with RAID 5 known to those skilled in art.

When two redundant storage devices 2033 and 2034 are provided, then disk 2000 continues to operate without loss of any data at least in the presence of failure of any two storage devices 2031, 2032, 2033 and 2034. The organization of data and redundant information may be in accordance with RAID 6 known to those skilled in art.

The ports 2001 and 2002 are presenting data stored in disk 2000 as two conventional independent mirrored disks also known as RAID 1 holding same data as disk 2000.

The power to disk 2000 is supplied through first connector 2051 coupled with first power supply unit 2053 via electric connections 2052.

The power to disk 2000 is also supplied through second connector 2061 coupled with second power supply unit 2063 via electric connections 2062.

The output of power first supply 2053 and output of second power supply 2063 are joined and distributed to disk controller and storage devices through electric power distribution network 2070.

The storage devices 2031, 2032, 2033, and 2034 are coupled to power distribution network 2070 via corresponding electric connections 2071, 2072, 2073, and 2073.

The disk controllers 2010, 2020 are coupled to power distribution network 2070 via corresponding electric connections 2075 and 2076.

When power supply to power connector 2051 fails, then the power to disk 2000 is supplied through power connector 2061. When power supply to power connector 2051 fails then the power to disk 2000 is supplied through power connector 2061.

When electric connection 2052 fails, the power to disk 2000 is supplied through electric connections 2062. When electric connection 2062 fails, the power to disk 2000 is supplied through electric connections 2052.

When power supply 2053 fails, then power to disk 2000 is supplied by power supply 2063. When power supply 2063 fails, then power to disk 2000 is supplied by power supply 2053.

When electric connection 2054 fails, the power to disk 2000 is supplied through electric connections 2064. When electric connection 2064 fails, the power to disk 2000 is supplied through electric connection 2054.

The disk controllers 2010, 2020 may contain circuits to detect that power to both power supplies 2053 and 2063 was disconnected and to provide power to save state of disk controllers 2010, 2020 into storage devices 2031, 2032, 2033, and 2034 such that no loss of data is possible. The power supplies 2053 and 2063 supply power to disk 2000 for enough time after power to both power supply to 2053, 2053 was disconnected in order to complete writing of state of disk controllers 2010, 2020 into storage devices 2031, 2032, 2033, and 2034.

The disk 2000 continues operate without lost of data in presence of any single failure of any element 2001, 2002, 2003, 2010, 2020, 2011, 2012, 2013, 2014, 2021, 2022, 2023, 2024, 2031, 2032, 2033, 2034, 2041, 2042, 2043, 2044, 2031, 2032, 2033, 2034, 2051, 2061, 2052, 2062, 2053, 2063, 2054, 2064, 2070, 2071, 2072, 2073, 2074, 2075, and 2076.

The storage devices 2031, 2032, 2033, and 2034 may be mechanical storage devices, non-mechanical storage devices, volatile or non-volatile storage, including but not limited to DRAM or flash storage, including but not limited to SLC and MLC NAND flash storage devices.

The disk controllers 2010 and 2020 may be implemented for example as two independent chips or may be implemented on one die or in any other way known to those skilled in art.

The disconnection of buses 2011, 2012, 2013, 2014, 2021, 2022, 2023, 2024, and 2025 may be implemented through three state circuits, multiplexers or other circuits known to those skilled in the art.

The power supply 2053, 2063 may include battery, capacitor or other components known to those skilled in art providing power to disk 2000 when power to power supply 2053, 2063 is disconnected.

Figure 3:
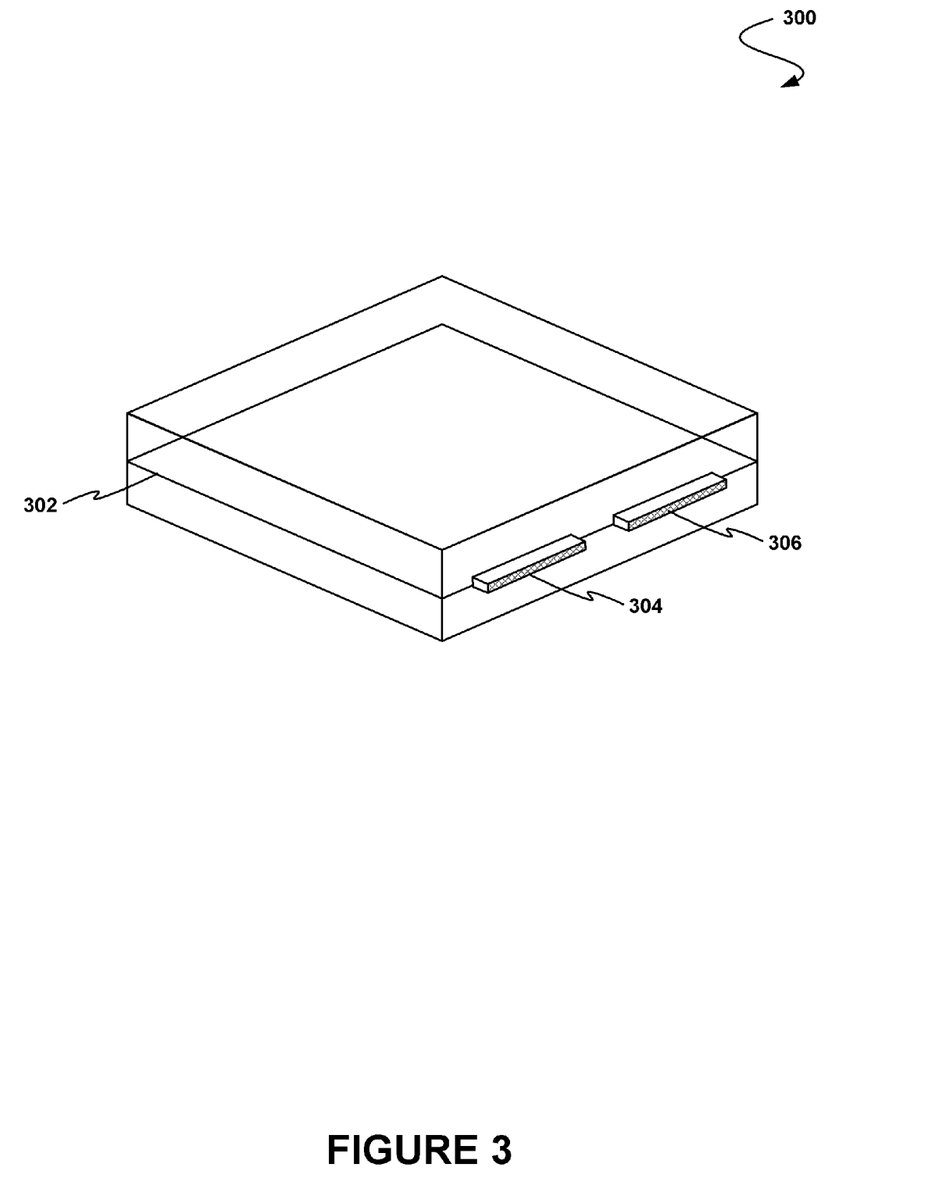
FIG. 3 shows a disk assembly, in accordance with one embodiment.

FIG. 3 shows a disk assembly 300, in accordance with one embodiment. As an option, the disk assembly 300 may be implemented in the context of the functionality and architecture of FIGS. 1-2. Of course, however, the disk assembly 300 may be implemented in the context of any desired environment. It should also be noted that the aforementioned definitions may apply during the present description.

As shown, the disk assembly 300 includes a printed circuit board 302 including a disk drive (not shown), a power connector with primary port as part of a SATA (Serial Advanced Technology Attachment) connector 304 and a power connector with a secondary port as part of a second SATA connector 306. In one embodiment, the disk assembly 300 may include SAS (Serial Attached SCSI) connectors. For example, the disk assembly 300 may include the printed circuit board 302 including a disk drive (not shown), a power connector with primary port as part of a SAS connector 304 and a power connector with a secondary port as part of a second SAS connector 306.

As an option, the connectors 304 and 306 may expose the disk assembly 300 as a certain data redundancy configuration. For example, an SATA interface may expose the disk assembly 300 as a pair of disks configured in a RAID 1 mode. In another embodiment, an SAS interface may expose the disk assembly 300 as pair of disks configured in a RAID 1 mode. In still another embodiment, an SATA and an SAS interface may expose the disk assembly 300 as plurality of disks configured in a RAID 0 mode.

Figure 4:
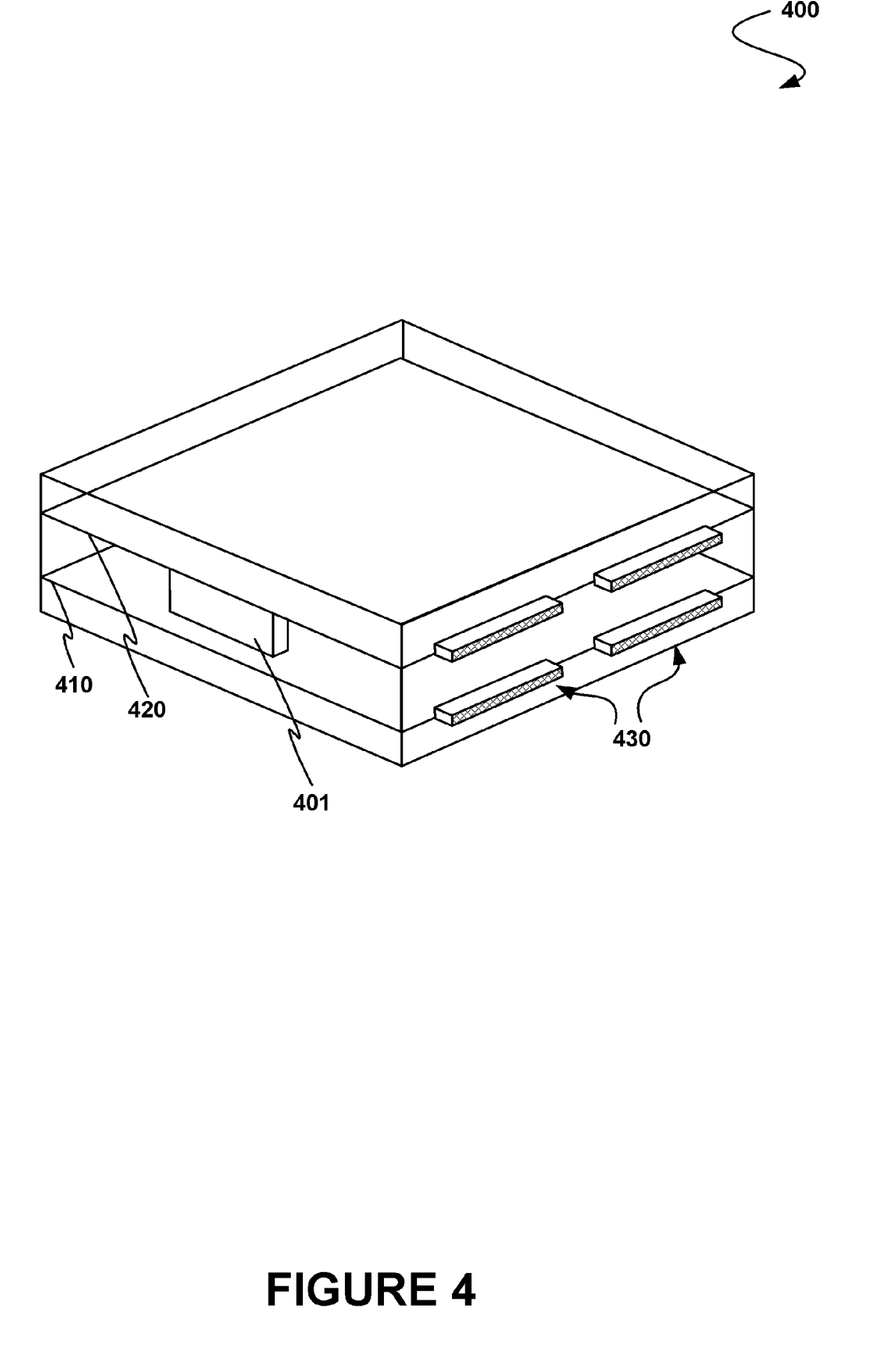
FIG. 4 shows a disk assembly, in accordance with another embodiment.

FIG. 4 shows a disk assembly 400, in accordance with another embodiment. As an option, the disk assembly 400 may be implemented in the context of the functionality and architecture of FIGS. 1-3. Of course, however, the disk assembly 400 may be implemented in the context of any desired environment. It should also be noted that the aforementioned definitions may apply during the present description.

As shown, the disk assembly 400 includes two or more disks assemblies 410 and 420. As an option, the disk assemblies 410 and 420 may include the disk assembly 300 from FIG. 3. In this case, each disk assembly 410 and 420 may include a printed circuit board, and connectors 430.

Optionally, each disk assembly 410 and 420 may be interconnected via an electrical connection 401. In this case, the electrical connection 401 may represent a disk controller bus, such as the disk controller bus 203 of FIG. 2B, for example. In operation, the disk assembly 400 may increase storage performance of a system by allowing more than one disk (e.g. disks assemblies 410 and 420) to occupy a space of a conventional or primary storage (e.g. a disk drive, etc.).

Figure 5:
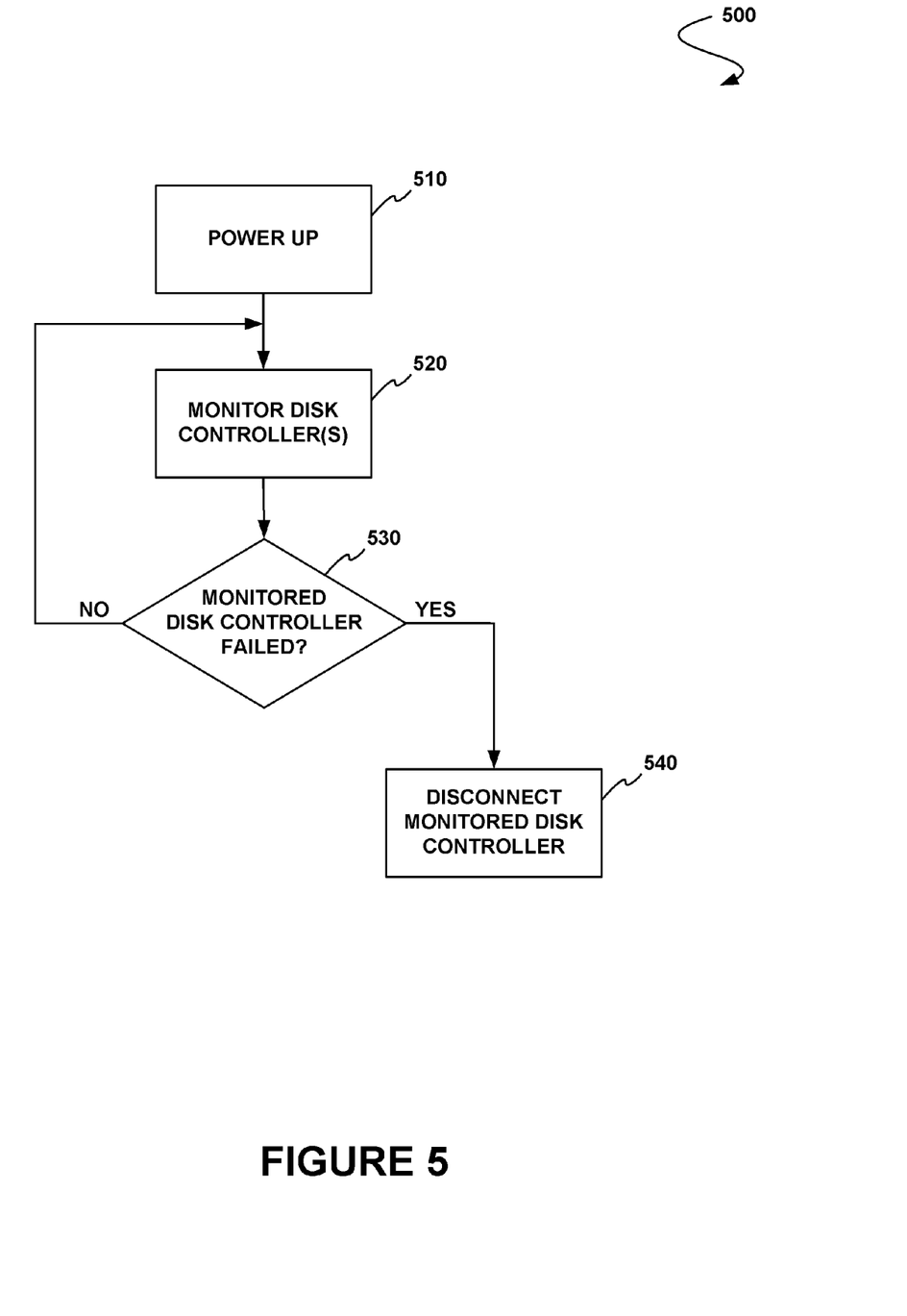
FIG. 5 shows a method for operating a redundant disk controller, in accordance with one embodiment.

FIG. 5 shows a method 500 for operating a redundant disk controller, in accordance with one embodiment. As an option, the present method 500 may be implemented in the context of the functionality and architecture of FIGS. 1-4. Of course, however, the method 500 may be carried out in any desired environment. It should also be noted that the aforementioned definitions may apply during the present description.

As shown, a storage system (e.g. a disk assembly, etc.) is powered up. See operation 510. A disk controller of the storage system is monitored. See operation 520. As an option, the disk controller may be monitored by another disk controller. Such monitoring may include monitoring the disk controller via a bus between the two disk controllers (e.g. the disk controller bus 203 of FIG. 2B, etc.), and/or monitoring activity on busses corresponding to storage devices of the storage system (e.g. busses 241-244 of the corresponding storage devices 231-234, etc.).

The storage system continues to operate, monitoring the disk controller, until it is determined that the monitored disk controller has failed. See operation 530. If the monitored disk controller fails, the monitored disk controller is disconnected. See operation 540.

In one embodiment, the disconnection of the disk controller may be implemented by issuing a disconnect command through the bus between the two disk controllers (e.g. the disk controller bus 203 of FIG. 2B, etc.). In this case, the disconnect command may include disconnecting busses linking the monitored disk controller to the storage devices (e.g. connections 211-214 or 221-224 of FIG. 2B). In one embodiment, a plurality of disk controllers may be monitored by other disk controllers. In this case, each disk controller in the plurality of disk controllers may be considered a monitored disk controller.

Figure 6:
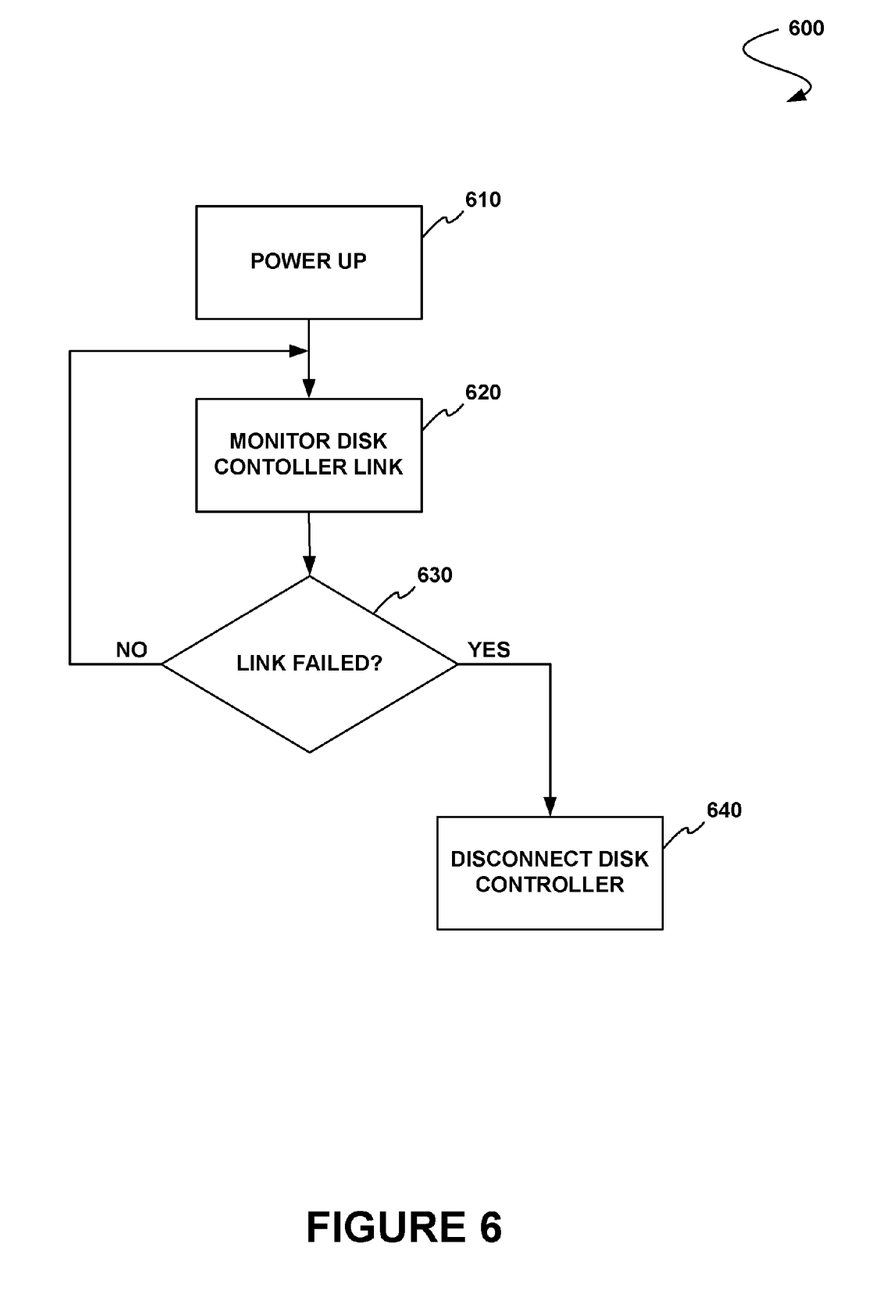
FIG. 6 shows a method for operating a redundant disk controller, in accordance with one embodiment.

FIG. 6 shows a method 600 for operating a redundant disk controller, in accordance with another embodiment. As an option, the present method 600 may be implemented in the context of the functionality and architecture of FIGS. 1-5. Of course, however, the method 600 may be carried out in any desired environment. It should also be noted that the aforementioned definitions may apply during the present description.

As shown, a storage system (e.g. a disk assembly, etc.) is powered up. See operation 610. A link between at least two disk controllers of the storage system is monitored. See operation 620. In one embodiment, the link between the disk controllers may include the disk controller bus 203 of FIG. 2B. Additionally, the link between the disk controllers may be monitored by at least one of the disk controllers (e.g. the first and second disk controller 210 and 220 of FIG. 2B, etc.).

The storage system continues to operate, monitoring the link, until it is determined that the link has failed. See operation 630. If the link fails, then one disk controller is disconnected. See operation 640.

In one embodiment, the disconnection may include disconnecting busses linking a disk controller to the storage devices (e.g. connections 211-214 or 221-224 of FIG. 2B, etc). In this case, commands received by a port associated with the disconnected controller may not be processed. As an example, a second of two disk controllers may be disconnected upon a failure of the link between a first and the second disk controller. In this case, the first controller may continue operating and commands from the ports of the second disk controller may not be processed.

Figure 7:
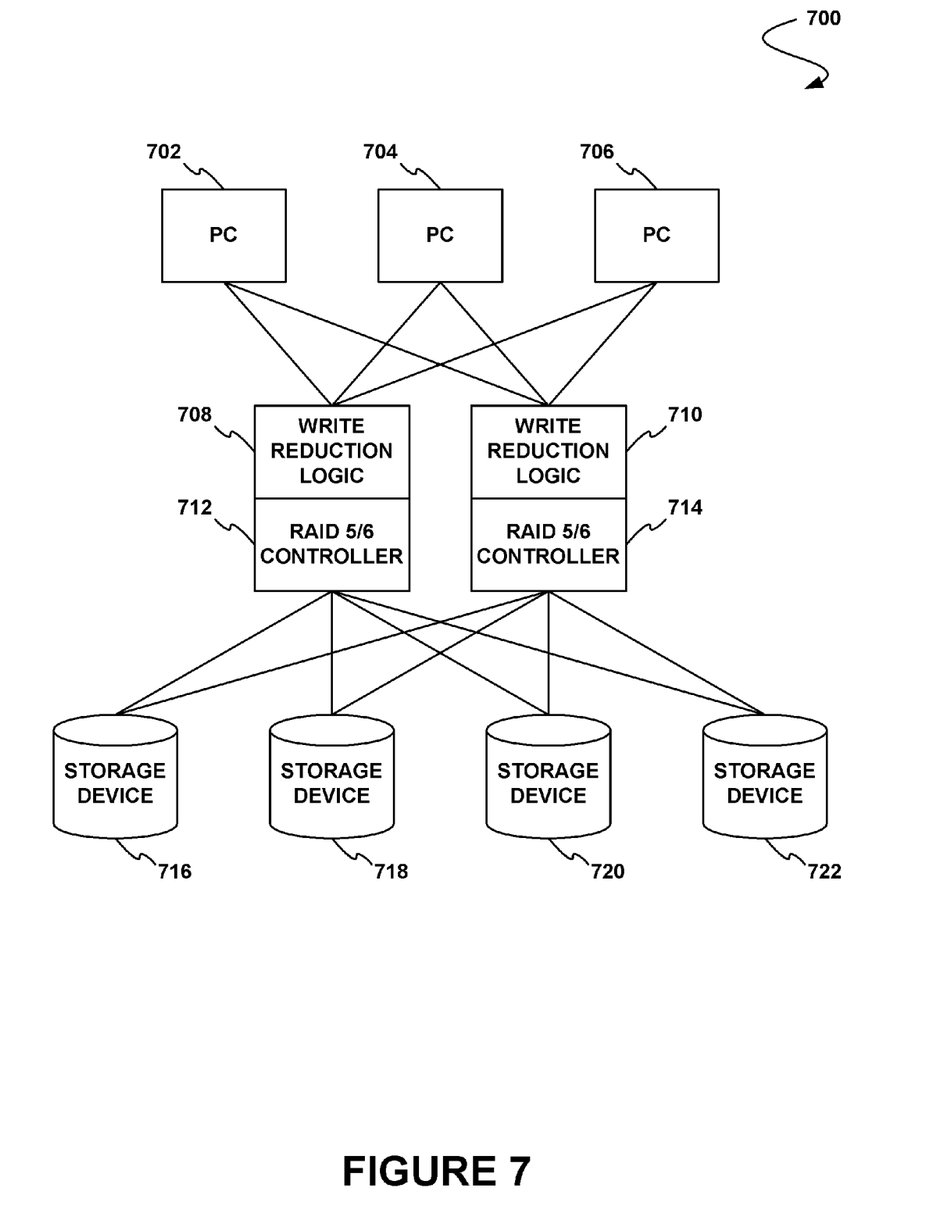
FIG. 7 shows a system for operating a redundant disk controller, in accordance with one embodiment.

FIG. 7 shows a system 700 for operating a redundant disk controller, in accordance with another embodiment. As an option, the system 700 may be implemented in the context of the functionality and architecture of FIGS. 1-6. Of course, however, the system 700 may be implemented in any desired environment. It should also be noted that the aforementioned definitions may apply during the present description.

As shown, at least one computer 702-706 is provided. The computers 702-706 are coupled to a plurality of RAID controllers 712-714. The controllers 712-714 are in communication with a plurality of storage devices 716-722. Such communication may include utilizing ports associated with the storage devices 716-722.

Reliability of the system 700 may be achieved by using storage devices 716-722 with intra-drive redundancy (e.g. the storage system 250 of FIG. 2B). Furthermore, all connections (e.g. busses, etc.) may be duplicated to ensure reliability of the system 700. As an option, the storage devices 716-722 may each include two ports per device, providing twice as much bandwidth compared to use of a storage device with a single port. Furthermore, each storage device 716-722 may simulate two disks by utilizing a redundancy system such as RAID 5, RAID 6, RAID 10, RAID 50, RAID 60, square parity redundancy schemas, etc.

As an option, write reduction logic 708-710 may be utilized to reduce a number of writes to the storage devices 716-722. In this case, translating storage commands for providing data redundancy may be performed after the reducing. For example, storage commands may be received for providing data redundancy in accordance with a first data redundancy scheme (e.g. RAID 5, RAID 6, RAID 10, RAID 50, RAID 60, square parity redundancy schemas, etc.) of the controllers 712-714.

The write reduction logic 708-710 may then be utilized to reduce a number of writes to the storage devices 716-722. The storage commands may then be translated (e.g. by a circuit) for providing the data redundancy in accordance with a second data redundancy scheme associated with the storage devices 716-722. In one embodiment, the second data redundancy scheme may be the same as the first data redundancy scheme (e.g. RAID 5, RAID 6, RAID 10, RAID 50, RAID 60, square parity redundancy schemas, etc.). In another embodiment, the second data redundancy scheme may be different than the first data redundancy scheme (e.g. RAID 1, RAID 6, RAID 10, RAID 50, RAID 60, square parity redundancy schemas, etc).

In one embodiment, the write reduction logic 708-710 may be utilized to format storage commands that are received for providing data redundancy in accordance with a first data redundancy scheme into a format compatible with the second data redundancy scheme. Strictly as an option, the RAID controllers 712-714 may include a system with intra-drive redundancy as described in the context of the storage devices 716-722. In this way, a number of writes to the storage devices 716-722 may be reduced. Thus, the storage commands may be translated for providing the data redundancy in accordance with a second data redundancy scheme associated with the storage devices 716-722 after the reduction of the number of writes. In this way, randomization of data may be avoided.

Figure 8:
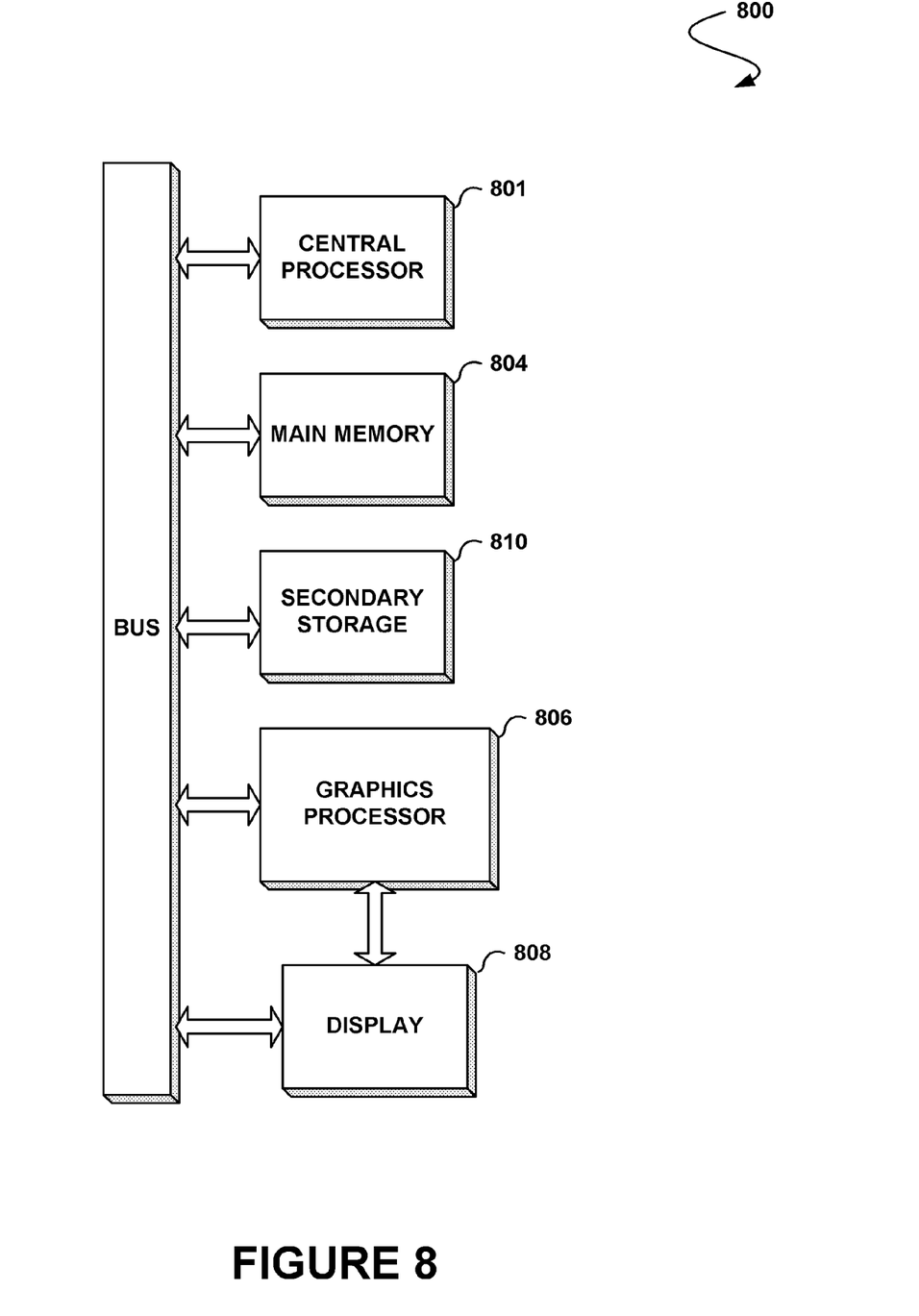
FIG. 8 illustrates an exemplary system in which the various architecture and/or functionality of the various previous embodiments may be implemented.

FIG. 8 illustrates an exemplary system 800 in which the various architecture and/or functionality of the various previous embodiments may be implemented. As shown, a system 800 is provided including at least one host processor 801 which is connected to a communication bus 802. The system 800 also includes a main memory 804. Control logic (software) and data are stored in the main memory 804 which may take the form of random access memory (RAM).

The system 800 also includes a graphics processor 806 and a display 808, i.e. a computer monitor. In one embodiment, the graphics processor 806 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 800 may also include a secondary storage 810. The secondary storage 810 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 804 and/or the secondary storage 810. Such computer programs, when executed, enable the system 800 to perform various functions. Memory 804, storage 810 and/or any other storage are possible examples of computer-readable media.

In one embodiment, the architecture and/or functionality of the various previous figures may be implemented in the context of the host processor 801, graphics processor 806, secondary storage 810, an integrated circuit (not shown) that is capable of at least a portion of the capabilities of both the host processor 801 and the graphics processor 806, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 800 may take the form of a desktop computer, lap-top computer, and/or any other type of logic. Still yet, the system 800 may take the form of various other devices including, but not limited to, a personal digital assistant (PDA) device, a mobile phone device, a television, etc.

Further, while not shown, the system 800 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
   receiving, at a storage controller, a storage command for providing data redundancy;
   implementing, by the storage controller, the data redundancy by receiving and reducing a number of writes in accordance with a first data redundancy scheme;
   translating, by the storage controller, the storage command for providing a subsequent data redundancy; and
   implementing, by the storage controller, the subsequent data redundancy in accordance with a second data redundancy scheme, the first data redundancy scheme differing from the second data redundancy scheme.

2. The method of claim 1, wherein the first data redundancy scheme is selected from the group consisting of a redundant array of independent disks (RAID)-5 data redundancy scheme, a RAID-6 data redundancy scheme, a RAID-10 data redundancy scheme, a RAID-50 data redundancy scheme, a RAID-60 data redundancy scheme, and a square parity redundancy scheme.

3. The method of claim 1, wherein the second data redundancy scheme is selected from the group consisting of a redundant array of independent disks (RAID)-5 data redundancy scheme, a RAID-6 data redundancy scheme, a RAID-10 data redundancy scheme, a RAID-50 data redundancy scheme, a RAID-60 data redundancy scheme, and a square parity redundancy scheme.

4. The method of claim 1, further comprising:
   outputting, by the storage controller, the translated storage commands for providing the subsequent data redundancy in a plurality of storage devices.

5. The method of claim 4, wherein the plurality of storage devices comprise one or more primary storage devices and one or more redundant storage devices.

6. The method of claim 1, further comprising:
   formatting, by the storage controller, the storage commands that are received for providing the data redundancy in accordance with the first data redundancy scheme into a format compatible with the second data redundancy scheme.

7. The method of claim 1, wherein the storage controller is a redundant array of independent disks (RAID) controller.

8. A storage system comprising:
   a plurality of storage devices; and
   a plurality of storage controllers in communication with the plurality of storage devices, the plurality of storage controllers configured to
      receive a storage command for providing data redundancy;
      implement the data redundancy by receiving and reducing a number of writes in accordance with a first data redundancy scheme;
      translate the storage command for providing a subsequent data redundancy; and
      implement the subsequent data redundancy in accordance with a second data redundancy scheme, the first data redundancy scheme differing from the second data redundancy scheme.

9. The storage system of claim 8, wherein the plurality of storage devices comprise one or more primary storage devices and one or more redundant storage devices.

10. The storage system of claim 8, wherein the first data redundancy scheme is selected from the group consisting of a redundant array of independent disks (RAID)-5 data redundancy scheme, a RAID-6 data redundancy scheme, a RAID-10 data redundancy scheme, a RAID-50 data redundancy scheme, a RAID-60 data redundancy scheme, and a square parity redundancy scheme.

11. The storage system of claim 8, wherein the second data redundancy scheme is selected from the group consisting of a redundant array of independent disks (RAID)-5 data redundancy scheme, a RAID-6 data redundancy scheme, a RAID-10 data redundancy scheme, a RAID-50 data redundancy scheme, a RAID-60 data redundancy scheme, and a square parity redundancy scheme.

12. The storage system of claim 8, wherein the plurality of storage controllers are further configured to:
output the translated storage commands for providing the subsequent data redundancy in the plurality of storage devices.

13. The storage system of claim 8, wherein the plurality of storage controllers are further configured to:
format the storage commands that are received for providing the data redundancy in accordance with the first data redundancy scheme into a format compatible with the second data redundancy scheme.

14. The storage system of claim 8, wherein the plurality of storage devices and the plurality of storage controllers utilize intra-drive redundancy.

15. A non-transitory machine-readable storage medium having embodied therein a computer program product, comprising:
computer code to receive a storage command for providing data redundancy;
computer code to implement the data redundancy by receiving and reducing a number of writes in accordance with a first data redundancy scheme;
computer code to translate the storage command for providing a subsequent data redundancy; and
computer code to implement the subsequent data redundancy in accordance with a second data redundancy scheme, the first data redundancy scheme differing from the second data redundancy scheme; and
computer code to output the translated storage commands for providing the subsequent data redundancy in a plurality of storage devices.

16. The non-transitory machine-readable storage medium of claim 15, wherein the plurality of storage devices comprise one or more primary storage devices and one or more redundant storage devices.

17. The non-transitory machine-readable storage medium of claim 15,
wherein the first data redundancy scheme is selected from the group consisting of a redundant array of independent disks (RAID)-5 data redundancy scheme, a RAID-6 data redundancy scheme, a RAID-10 data redundancy scheme, a RAID-50 data redundancy scheme, a RAID-60 data redundancy scheme, and a square parity redundancy scheme, and
wherein the second data redundancy scheme is selected from the group consisting of a redundant array of independent disks (RAID)-5 data redundancy scheme, a RAID-6 data redundancy scheme, a RAID-10 data redundancy scheme, a RAID-50 data redundancy scheme, a RAID-60 data redundancy scheme, and a square parity redundancy scheme.

18. The non-transitory machine-readable storage medium of claim 15, wherein the plurality of storage devices comprise one or more primary storage devices and one or more redundant storage devices.

19. The non-transitory machine-readable storage medium of claim 15, the computer program product further comprising computer code to format the storage commands that are received for providing data redundancy in accordance with a first data redundancy scheme into a format compatible with the second data redundancy scheme.

20. The non-transitory machine-readable storage medium of claim 15, wherein the plurality of storage devices are configured to utilize intra-drive redundancy.

* * * * *